United States Patent
Gaff et al.

(10) Patent No.: US 8,642,480 B2
(45) Date of Patent: Feb. 4, 2014

(54) ADJUSTING SUBSTRATE TEMPERATURE TO IMPROVE CD UNIFORMITY

(75) Inventors: Keith William Gaff, Fremont, CA (US); Harmeet Singh, Fremont, CA (US); Keith Comendant, Fremont, CA (US); Vahid Vahedi, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 170 days.

(21) Appl. No.: 12/966,506

(22) Filed: Dec. 13, 2010

(65) Prior Publication Data

US 2011/0143462 A1 Jun. 16, 2011

Related U.S. Application Data

(60) Provisional application No. 61/286,653, filed on Dec. 15, 2009.

(51) Int. Cl.
*H01L 21/66* (2006.01)
*H01L 21/3065* (2006.01)

(52) U.S. Cl.
USPC ............ 438/715; 438/706; 438/710; 216/59; 216/67

(58) Field of Classification Search
USPC ...................... 438/706, 710, 715; 216/59, 67
See application file for complete search history.

(56) References Cited

U.S. PATENT DOCUMENTS

| | | | |
|---|---|---|---|
| 3,440,883 A | 4/1969 | Lightner | |
| 5,255,520 A | 10/1993 | O'Geary et al. | |
| 5,414,245 A | 5/1995 | Hackleman | |
| 5,504,471 A | 4/1996 | Lund | |
| 5,515,683 A | 5/1996 | Kessler | |
| 5,536,918 A | 7/1996 | Ohkase et al. | |
| 5,635,093 A | 6/1997 | Arena et al. | |
| 5,665,166 A | 9/1997 | Deguchi et al. | |
| 5,667,622 A | 9/1997 | Hasegawa et al. | |
| 5,740,016 A | 4/1998 | Dhindsa | |
| 5,802,856 A | 9/1998 | Schaper et al. | |
| 5,851,298 A | 12/1998 | Ishii | |
| 5,886,866 A | 3/1999 | Hausmann | |
| 6,060,697 A | 5/2000 | Morita et al. | |
| 6,095,084 A | 8/2000 | Shamouilian et al. | |
| 6,100,506 A | 8/2000 | Colelli, Jr. et al. | |
| 6,175,175 B1 | 1/2001 | Hull | |
| 6,222,161 B1 | 4/2001 | Shirakawa et al. | |
| 6,271,459 B1 | 8/2001 | Yoo | |
| 6,353,209 B1 | 3/2002 | Schaper et al. | |
| 6,403,403 B1 | 6/2002 | Mayer et al. | |
| 6,475,336 B1 | 11/2002 | Hubacek | |
| 6,483,690 B1 | 11/2002 | Nakajima et al. | |
| 6,512,207 B1 | 1/2003 | Dress et al. | |
| 6,523,493 B1 | 2/2003 | Brcka | |
| 6,566,632 B1 | 5/2003 | Katata et al. | |
| 6,612,673 B1 | 9/2003 | Giere et al. | |
| 6,664,515 B2 | 12/2003 | Natsuhara et al. | |
| 6,739,138 B2 | 5/2004 | Saunders et al. | |
| 6,740,853 B1 | 5/2004 | Johnson et al. | |
| 6,741,446 B2 | 5/2004 | Ennis | |
| 6,746,616 B1 | 6/2004 | Fulford et al. | |
| 6,795,292 B2 | 9/2004 | Grimard et al. | |
| 6,815,365 B2 | 11/2004 | Masuda et al. | |
| 6,825,617 B2 | 11/2004 | Kanno et al. | |
| 6,847,014 B1 | 1/2005 | Benjamin et al. | |
| 6,886,347 B2 | 5/2005 | Hudson et al. | |
| 6,921,724 B2 | 7/2005 | Kamp et al. | |
| 6,979,805 B2 | 12/2005 | Arthur et al. | |
| 6,985,000 B2 | 1/2006 | Feder et al. | |
| 6,989,210 B2 | 1/2006 | Gore | |
| 7,075,031 B2 | 7/2006 | Strang et al. | |
| 7,141,763 B2 | 11/2006 | Moroz | |
| 7,173,222 B2 | 2/2007 | Cox et al. | |
| 7,175,714 B2 | 2/2007 | Ootsuka et al. | |
| 7,206,184 B2 | 4/2007 | Ennis | |
| 7,230,204 B2 | 6/2007 | Mitrovic et al. | |
| 7,250,309 B2 | 7/2007 | Mak et al. | |
| 7,268,322 B2 | 9/2007 | Kuibira et al. | |
| 7,274,004 B2 | 9/2007 | Benjamin et al. | |
| 7,275,309 B2 | 10/2007 | Matsuda et al. | |
| 7,279,661 B2 | 10/2007 | Okajima et al. | |
| 7,297,894 B1 | 11/2007 | Tsukamoto | |
| 7,311,782 B2 | 12/2007 | Strang et al. | |
| 7,372,001 B2 | 5/2008 | Tachikawa et al. | |
| 7,396,431 B2 | 7/2008 | Chen et al. | |
| 7,415,312 B2 | 8/2008 | Barnett, Jr. et al. | |
| 7,475,551 B2 | 1/2009 | Ghoshal | |

(Continued)

FOREIGN PATENT DOCUMENTS

| | | | |
|---|---|---|---|
| JP | 2005123286 A | | 5/2005 |
| JP | 2005-294237 A | | 10/2005 |
| KR | 20080058109 A | | 6/2008 |

OTHER PUBLICATIONS

Commonly-Owned Utility U.S. Appl. No. 12/582,991, filed Oct. 21, 2009.
Commonly-Owned Utility U.S. Appl. No. 12/910,347, filed Oct. 22, 2010.
Commonly-Owned Utility U.S. Appl. No. 12/943,492, filed Nov. 10, 2010.
International Search Report and Written Opinion dated Aug. 24, 2011 for PCT/US2010/003149.
Commonly-Owned Utility U.S. Appl. No. 13/234,473, filed Sep. 16, 2011.
Commonly-Owned Utility U.S. Appl. No. 13/237,444, filed Sep. 20, 2011.
Commonly-Owned Utility U.S. Appl. No. 13/238,396, filed Sep. 21, 2011.

(Continued)

*Primary Examiner* — Shamim Ahmed
(74) *Attorney, Agent, or Firm* — Buchanan Ingersoll & Rooney PC

(57) ABSTRACT

A plasma etching system having a substrate support assembly with multiple independently controllable heater zones. The plasma etching system is configured to control etching temperature of predetermined locations so that pre-etch and/or post-etch non-uniformity of critical device parameters can be compensated for.

16 Claims, No Drawings

(56) References Cited

U.S. PATENT DOCUMENTS

| | | | |
|---|---|---|---|
| 7,480,129 B2 | 1/2009 | Brown et al. |
| 7,504,006 B2 | 3/2009 | Gopalraja et al. |
| 7,782,583 B2 | 8/2010 | Moon |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 8,057,602 B2 | 11/2011 | Koelmel et al. |
| 8,222,574 B2 | 7/2012 | Sorabji et al. |
| 2002/0043528 A1 | 4/2002 | Ito |
| 2003/0165755 A1* | 9/2003 | Mui et al. ............ 430/30 |
| 2004/0200574 A1* | 10/2004 | Davis et al. ............ 156/345.1 |
| 2005/0016465 A1 | 1/2005 | Ramaswamy et al. |
| 2005/0215073 A1 | 9/2005 | Nakamura et al. |
| 2005/0229854 A1 | 10/2005 | Moroz |
| 2006/0191637 A1 | 8/2006 | Zajac et al. |
| 2006/0226123 A1 | 10/2006 | Birang |
| 2007/0125762 A1 | 6/2007 | Cui et al. |
| 2007/0296980 A1* | 12/2007 | Mak et al. ............ 356/625 |
| 2008/0029195 A1 | 2/2008 | Lu |
| 2008/0049374 A1 | 2/2008 | Morioka et al. |
| 2008/0202924 A1 | 8/2008 | Bluck et al. |
| 2009/0000738 A1 | 1/2009 | Benjamin |
| 2009/0173445 A1 | 7/2009 | Yeom et al. |
| 2009/0183677 A1 | 7/2009 | Tian et al. |
| 2010/0078424 A1 | 4/2010 | Tsukamoto et al. |
| 2010/1011678 | 5/2010 | Singh et al. |
| 2010/0257871 A1 | 10/2010 | Venkatasubramanian et al. |
| 2010/0283565 A1 | 11/2010 | Blakes |
| 2011/0005682 A1 | 1/2011 | Savas et al. |
| 2011/0033175 A1 | 2/2011 | Kasai et al. |
| 2011/0092072 A1 | 4/2011 | Singh et al. |
| 2011/0143462 A1 | 6/2011 | Gaff et al. |

OTHER PUBLICATIONS

Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.

* cited by examiner

US 8,642,480 B2

ADJUSTING SUBSTRATE TEMPERATURE TO IMPROVE CD UNIFORMITY

RELATED APPLICATION

This application claims priority under 35 U.S.C. §119 to U.S. Provisional Application No. 61/286,653 filed Dec. 15, 2009, the content of which is incorporated herein by reference in its entirety.

BACKGROUND

With each successive semiconductor technology generation, diameters of substrates, e.g., wafers, tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non plasma applications such as electron beam deposition, as well as plasma applications, such as sputter deposition, plasma-enhanced chemical vapor deposition (PECVD), resist strip, and plasma etch.

Plasma etching systems available today are among those semiconductor fabrication tools which are subject to an increasing need for improved accuracy and repeatability. One metric for plasma etching systems is increased uniformity, which includes uniformity of process results on a semiconductor substrate surface as well as uniformity of process results of a succession of substrates processed with nominally the same input parameters. Continuous improvement of within-substrate uniformity is desirable. Among other things, this calls for plasma chambers with improved uniformity, consistency and self diagnostics.

SUMMARY

Disclosed herein is a method of using a plasma etching system comprising a substrate support assembly for supporting a substrate during plasma etching, the substrate support assembly comprising a plurality of independently controllable heater zones in an arrangement under device die locations on the substrate, and a controller unit that controls each heater zone. The method comprises (a) measuring pre-etch, or post-etch critical device parameters from previously etched substrate, on the device die locations of the substrate on the substrate; (b) communicating the pre-etch or post-etch critical device parameters to the plasma etching system; (c) subsequently supporting the substrate on the substrate support assembly; (d) communicating process recipe parameters to the plasma etching system and/or loading process recipe parameters from a memory to the plasma etching system; (e) deducing target etching temperatures at pre-determined locations on the substrate from the process recipe parameters, target post-etch critical device parameter data, and the pre-etch critical device parameters from incoming substrates, and/or the post-etch critical device parameters from previously etched substrate; (f) adjusting temperature at each pre-determined location based on the target etching temperature at the predetermined location using the controllable heater zones; and (g) plasma etching the substrate.

DETAILED DESCRIPTION

Radial and azimuthal substrate temperature control in a semiconductor processing apparatus to achieve target critical dimension (CD) uniformity on the substrate is becoming more demanding. Even a small variation of temperature may affect CD to an unacceptable degree, especially as CD approaches sub-20 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate holder, a fluid-cooled heat sink (hereafter referred to as cooling plate) and a plurality of concentric heater zones to realize step by step and radial temperature control. Typically, the cooling plate is maintained between 0° C. and 30° C. The heaters are located on the cooling plate with a layer of thermal insulator in between. The heaters can maintain the support surface of the substrate support assembly at temperatures about 0° C. to 80° C. above the cooling plate temperature. By changing the heater power within the plurality of heater zones, the substrate support temperature profile can be changed between center hot, center cold, and uniform. Further, the mean substrate support temperature can be changed step by step within the operating range of 0 to 80° C. above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating the cooling elements in the electrostatic chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

Non-uniformity in the critical dimension can be caused by upstream processes, for example, photolithography. Because of the parallel nature of photolithography (i.e. all device dies on a substrate are exposed together) and factors difficult to control such as light source non-uniformity, diffraction on photomasks, non-uniformity in temperature, non-uniformity in photoresist thickness, etc., post-lithography and pre-etch substrates usually have non-uniformity in device features. If unchecked and allowed to propagate to downstream processes, such non-uniformity can result in reduced device yield.

It would be advantageous and desirable to incorporate multiple independently controllable heater zones in the substrate support assembly to enable a plasma etching system to actively create and maintain the target spatial and temporal temperature profile, and to compensate for adverse factors that affect CD uniformity.

A substrate support assembly with independently controlled heater zones is described in U.S. patent application Ser. No. 12/582,991 filed on Oct. 21, 2009, which is hereby incorporated by reference.

Described herein is a method of using a plasma etching system having a substrate support assembly with independently controllable heater zones, for compensation for non-uniformity on a substrate to be etched by measuring pre-etch critical device parameters, or post-etch critical device parameters from previously etched substrate, on a plurality of device die locations on the substrate and using the measured information to tune temperatures at predetermined locations on the substrate during etching.

For example, after a substrate undergoes lithography, a pattern is formed in a resist layer on the substrate. The pattern in the resist layer can have non-uniformity in critical dimensions. Pre-etch critical dimensions in the resist layer on each device die on the substrate can be measured with a suitable tool. The patterned resist layer is used as a mask in later plasma etching of the substrate underneath. Temperature during plasma etching can affect critical dimensions of the etched pattern in the substrate (post-etch critical dimensions). If the pre-etch critical dimensions at a device die location are determined to fall outside of tolerable error from target values, etching temperature of the device die location can be tuned by the heater zones such that the post-etch critical dimensions are within tolerable error from the target values. Thus, the measured pre-etch critical dimensions can be used to adjust etching temperature of each device die location to compensate for the particular amount of error in the pre-etch critical dimensions at the device die location.

The plasma etching system can have independently controllable heater zones assembled in a heating plate, and a controller unit that controls each heater zone. By tuning the power of each heater zone under control of the controller unit, the temperature profile during processing can be shaped both radially and azimuthally. The heater zones are preferably arranged in a defined pattern, for example, a rectangular grid, a hexagonal grid, or other pattern. Each heater zone of the heating plate is preferably of similar size (e.g. ±10%) to a single device die on the substrate. In an exemplary arrangement, to minimize the number of electrical connections, power supply and power return lines are arranged such that each power supply line is connected to a different group of heater zones and each power return line is connected to a different group of heater zones with each heater zone being in one of the groups connected to a particular power supply line and one of the groups connected to a particular power return line. No two heater zones are connected to the same pair of power supply and power return lines. Thus, a heater zone can be activated by directing electrical current through a pair of power supply and power return lines to which this particular heater zone is connected. The power of the heater elements is preferably smaller than 20 W, more preferably 5 to 10 W. The heater elements can be Peltier devices and/or resistive heaters such as polyimide heaters, silicone rubber heaters, mica heaters, metal heaters (e.g. W, Ni/Cr alloy, Mo or Ta), ceramic heaters (e.g. WC), semiconductor heaters or carbon heaters. The heater elements may be screen printed, wire wound or etched foil heaters. The thickness of the heater elements may range from 2 micrometers to 1 millimeter, preferably 5-80 micrometers. To allow space between heater zones and/or power supply and power return lines, the total area of the heater zones may be up to 90% of the area of the upper surface of the substrate support assembly, e.g. 50-90% of the area. The power supply lines or the power return lines (power lines, collectively) may be arranged in gaps ranging from 1 to 10 mm between the heater zones, or in separate planes separated from the heater zones plane by electrically insulating layers. The power supply lines and the power return lines are preferably made as wide as the space allows, in order to carry large current and reduce Joule heating. The power lines can be in the same plane as the heater zones, or can be on different planes than the heater zones. The materials of the power supply and power return lines may be the same as or different from the materials of the heater elements. Preferably, the materials of the power supply and power return lines are materials with low resistivity, such as Cu, Al, W, Inconel® or Mo. The substrate support assembly is operable to control the substrate temperature and consequently the plasma etching process at each device die location to maximize the yield of devices from the substrate. The plasma etching system preferably has at least 9 heater zones.

In one embodiment, the plasma etching system is able to receive measured critical device parameters (e.g. pre-etch critical dimensions) at a plurality of device die locations (preferably at least one location in each device die location) on a substrate to be processed therein (pre-etch critical device parameters), from sources such as a human user, an onboard measurement tool, a host network (a network that shares data between processing tools in a processing line) or the like. Preferably, the plasma etching system receives pre-etch critical device parameters of a batch of substrates to be processed, from an off-board inspection tool via a host communication network. Such off-board inspection tool can be an optical and/or electron beam inspection tool. The plasma etching system can have a hardware and/or software interface for receiving the pre-etch critical device parameters. The plasma etching system can have suitable software for processing the pre-etch critical device parameters.

The plasma etching system is also able to receive through a hardware and/or software interface and/or load from a memory, process recipe parameters that define dependence of target post-etch critical device parameters on the measured pre-etch critical device parameters and etching temperatures; and to deduce target etching temperature at predetermined locations on the substrate from the process recipe parameters, target post-etch critical device parameters, and measured pre-etch critical device parameters. Preferably, the plasma etching system is able to receive such process recipe parameters for each process recipe step.

Preferably, the plasma etching system is further able to calculate target control parameters (parameters that can be directly controlled such as power, voltage, current, etc.) for each heater zone based on the target etching temperature of each device die location to achieve the target critical device parameter for each device die.

The target control parameters can be obtained during manufacture of the substrate support assembly, by measuring response of surface temperatures of the substrate support assembly to different control parameters applied thereto. Alternatively, the target control parameters can be determined by using a theoretical or empirical model such as heat transfer theories or finite element analyses.

Preferably, a steady gain matrix can be used to calculate the target control parameters with direct response of each device die location to a control parameter applied to a heater zone underneath, and with indirect response (crosstalk) of said device die to control parameters applied to other heater zones. A steady gain matrix can be calculated using methods described in *Matrix Computation* by G. Golub, et al. (The Johns Hopkins University Press, Boston 1996), which is hereby incorporated by reference in its entirety.

In one embodiment, assuming the plasma etching system has n independent heater zones. Their respective control parameter is $X_i$ (i=1, 2, ..., n). All the control parameters $X_i$ can be written as a vector:

$$X = \begin{pmatrix} X_1 \\ X_2 \\ \vdots \\ X_n \end{pmatrix},$$

wherein $X_i$ is preferably time-averaged power applied to the i-th heater zone.

$T_i$ is a target etching temperature at a device die location within the i-th heater zone, which can be written as another vector:

$$T = \begin{pmatrix} T_1 \\ T_2 \\ \vdots \\ T_n \end{pmatrix},$$

The vector T is a function of the vector X. A relationship between the vector X and T can described by a n-by-n matrix K, wherein T=K·X. Diagonal elements $K_{ii}$, can be measured during manufacture of the substrate support assembly or the plasma etching system. Off-diagonal elements $K_{ij}$ (i≠j) can be measured during manufacture of the substrate support assembly or plasma etching system, or derived from a finite element thermal model, the values of diagonal elements and the physical distance between the i-th and j-th heater zones. The matrix K is stored in the plasma etching system. The plasma etching system also has software or firmware functional to execute an algorithm to deduce X based on T. The algorithm is a matrix inversion followed by a matrix multiplication, i.e. $X=K^{-1} \cdot T$.

In another embodiment, assuming the plasma etching system has n independent heater zones. Their respective control parameter is $X_i$ (i=1, 2, ..., n). All the control parameters $X_i$ can be written as a vector:

$$X = \begin{pmatrix} X_1 \\ X_2 \\ \vdots \\ X_n \end{pmatrix},$$

wherein $X_i$ is preferably time-averaged power applied to the i-th heater zone.

$P=\{P_j\}$ is a set of predicated etching temperatures at predetermined locations on the substrate at which the temperature response to each heater zone is known based on prior modeling or calibration measurements. P can be written as another vector:

$$P = \begin{pmatrix} P_1 \\ P_2 \\ \vdots \\ P_m \end{pmatrix},$$

$T=\{T_j\}$ are a set of target etching temperatures at the same predetermined locations on the substrate. T can be written as another vector:

$$T = \begin{pmatrix} T_1 \\ T_2 \\ \vdots \\ T_m \end{pmatrix},$$

In this embodiment, the number m of the locations on the substrate having respective target etching temperatures does not equal the number of heater zones, i.e., m≠n. The locations having temperature response may differ from the locations of the heater zones. The vector P is a function of the vector X. A relationship between the vector P and T can be described by an m-by-n matrix K, wherein P=K·X. Elements $K_{ij}$ can be measured during manufacture of the substrate support assembly or plasma etching system, or derived from a finite element thermal model. The matrix K is stored in the plasma etching system. The plasma etching system also has software or firmware functional to execute an algorithm to deduce X based on T, using the matrix and an optimization algorithm, e.g., a least squares optimization. The optimization algorithm facilitates determination of heater power setpoints by minimizing the differences between predicted temperatures at device die locations and target temperatures at the respective locations on the substrate.

In the above embodiments, the location at which the substrate characteristics, e.g., CD measurements, are measured may differ from the number of heater zones. In addition, the locations at which the substrate characteristics are measured may not coincide with the locations at which temperature response for each heater zone is known based on modeling or previous measurements, e.g., during manufacturing. That is, the substrate characteristics measurement locations differ from those used to construct the matrix K. Consequently, the substrate characteristics need to be estimated at the same locations as those used to construct matrix K. In a preferred embodiment, a technique, such as linear or nonlinear interpolation, can be used to transform the data for the substrate characteristics, e.g. CD measurements, from the substrate characteristics measurement locations to the locations at which the individual heater responses have been modeled/measured during calibration, i.e., the locations used to construct matrix K.

In an alternative embodiment, the control parameters can be dynamically determined by a control circuit (e.g. a PID controller) based on output of temperature sensors (e.g. optical sensors, thermal couples, diodes, or the like) in each heater zone.

While the method of using a plasma etching system has been described in detail with reference to specific embodiments thereof, it will be apparent to those skilled in the art that various changes and modifications can be made, and equivalents employed, without departing from the scope of the appended claims.

We claim:

1. A method of using a plasma etching system, the plasma etching system comprising a substrate support assembly for supporting a substrate during plasma etching, the substrate support assembly comprising a plurality of independently controllable heater zones in an arrangement under device die locations on the substrate, and a controller unit that controls each heater zone; the method comprising:

measuring pre-etch critical device parameters on a plurality of device die locations on the substrate;

communicating at least one of the pre-etch critical device parameters and post-etch critical device parameters from previously etched substrate to the plasma etching system;

subsequently supporting the substrate on the substrate support assembly;

communicating process recipe parameters to the plasma etching system and/or loading process recipe parameters from a memory to the plasma etching system;

deducing a target etching temperature for predetermined locations on the substrate from at least one of the process recipe parameters, target post-etch critical device parameters, the pre-etch critical device parameters, and the post-etch critical device parameters;

adjusting temperature of each device die location to its target etching temperature, using the controllable heater zones; and plasma etching the substrate.

2. The method of claim 1, further comprising communicating process recipe parameters to the plasma etching system and/or loading process recipe parameters from a memory to the plasma etching system for each step of an etching process recipe.

3. The method of claim 1, further comprising communicating and/or calculating target control parameters of each heater zone based on the target etching temperatures at the predetermined locations on the substrate.

4. The method of claim 1, wherein when the number of the heater zones and the number of the device die locations are equal, the step of adjusting temperature using the controllable heater zones comprises:

determining heater power setpoints for the heater zones by multiplying an inversed matrix describing a relationship of the target control parameters of the heater zones and the target etching temperatures of the device die locations by a vector whose elements are the target etching temperatures of the device die locations.

5. The method of claim 1, wherein the plasma etching system comprises one or more temperature sensors configured to measure etching temperature of each heater zone location, the method further comprising calculating target control parameters of each heater zone based on outputs from the temperature sensors.

6. The method of claim 1, wherein when the number of the heater zones and the number of the device die locations are not equal, the step of adjusting temperature using the controllable heater zones includes:

determining heater power setpoints for the heater zones based on a matrix describing a relationship of the target control parameters of the heater zones and predicted etching temperatures of the predetermined locations on the substrate, wherein the difference between the predicted etching temperatures of the device die locations and the target etching temperatures of the device die locations is minimized by an optimization technique.

7. The method of claim 6, wherein the optimization technique is a least squares optimization.

8. A method of using a plasma etching system, the plasma etching system comprising a substrate support assembly for supporting a substrate during plasma etching, the substrate support assembly comprising independently controllable heater zones in an arrangement under device die locations on the substrate, and a controller unit that controls each heater zone; the method comprising:

measuring pre-etch critical device parameters at a first set of predetermined locations on the substrate;

communicating at least one of the pre-etch critical device parameters and post-etch critical device parameters from previously etched substrate to the plasma etching system;

subsequently supporting the substrate on the substrate support assembly;

communicating at least one of process recipe parameters and loading process recipe parameters from a memory to the plasma etching system;

deducing target etching temperatures at a second set of predetermined locations on the substrate based on at least one of the process recipe parameters, target post-etch critical device parameters, the pre-etch critical device parameters, and the post-etch critical device parameters;

determining heater power setpoints for the controllable heater zones based on a relationship between the heater power for each of the heater zones and the predicted etching temperatures at the second set of predetermined locations, wherein the heater power setpoints are determined such that the difference between the predicted etching temperatures and the target etching temperatures is minimized by an optimization technique;

plasma etching the substrate.

9. The method of claim 8, wherein the optimization technique is a least squares optimization.

10. The method of claim 8, wherein deducing target etching temperatures includes estimating data of pre-etch or post-etch critical device parameters at the second set of predetermined locations based on the data of the pre-etch or post-etch critical device parameters at the first set of predetermined locations.

11. The method of claim 10, wherein the estimating includes interpolating the data of pre-etch or post-etch critical device parameters at the second set of predetermined locations based on the data of the pre-etch or post-etch critical device parameters at the second set of predetermined locations.

12. The method of claim 8, wherein a relationship between the heater power for each of the heater zones and the predicted etching temperatures at the second set of predetermined locations is described by a matrix.

13. The method of claim 11, wherein the interpolating is a linear interpolation.

14. The method of claim 11, wherein the interpolating is a non-linear interpolation.

15. The method of claim 1, the method comprising deducing a target etching temperature for the predetermined locations on the substrate from at least one of the process recipe parameters and target post-etch critical device parameters.

16. The method of claim 8, the method comprising deducing target etching temperatures at the second set of predetermined locations on the substrate based on at least one of the process recipe parameters and target post-etch critical device parameters.

* * * * *